United States Patent
Chen et al.

(10) Patent No.: US 10,083,754 B1
(45) Date of Patent: Sep. 25, 2018

(54) DYNAMIC SELECTION OF SOFT DECODING INFORMATION

(71) Applicant: Western Digital Technologies, Inc., San Jose, CA (US)

(72) Inventors: Niang-Chu Chen, Irvine, CA (US); Scott Kayser, San Diego, CA (US); Jun Tao, Ladera Ranch, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/614,415

(22) Filed: Jun. 5, 2017

(51) Int. Cl.
| G11C 8/10 | (2006.01) |
| G11C 16/08 | (2006.01) |
| G11C 16/10 | (2006.01) |
| G11C 7/22 | (2006.01) |

(52) U.S. Cl.
CPC .............. *G11C 16/08* (2013.01); *G11C 7/22* (2013.01); *G11C 8/10* (2013.01); *G11C 16/107* (2013.01)

(58) Field of Classification Search
CPC .................................. G11C 8/10; G11C 7/22
USPC ............................................ 365/230.06, 240
See application file for complete search history.

(56) References Cited

U.S. PATENT DOCUMENTS

| 3,925,780 A * | 12/1975 | Van Voorhis | G06T 9/005 341/106 |
| 5,920,661 A * | 7/1999 | Mori | G06K 7/14 358/400 |
| 6,546,478 B1 * | 4/2003 | Keller | G06F 9/30149 712/204 |
| 8,250,437 B2 | 8/2012 | Sakurada et al. | |
| 8,625,347 B2 | 1/2014 | Sakurada | |
| 8,847,797 B1 * | 9/2014 | Barr | H03M 7/30 341/51 |
| 9,304,851 B2 | 4/2016 | Wu et al. | |
| 9,397,701 B1 | 7/2016 | Micheloni et al. | |
| 9,450,610 B1 | 9/2016 | Micheloni et al. | |
| 2010/0080303 A1 * | 4/2010 | Suzuki | H04N 19/44 375/240.25 |
| 2012/0069131 A1 * | 3/2012 | Abelow | G06Q 10/067 348/14.01 |
| 2013/0096929 A1 * | 4/2013 | Jax | G10L 19/24 704/500 |
| 2013/0166988 A1 * | 6/2013 | Sharon | G06F 11/1012 714/758 |

(Continued)

*Primary Examiner* — Michael Tran
(74) *Attorney, Agent, or Firm* — McDermott Will & Emery LLP

(57) ABSTRACT

Multiple reads of memory cells of a flash memory device are initiated at different read levels to obtain raw data. For each different read level, multiple decoding operations are initiated to decode the raw data, each decoding operation using a different one of a plurality of sets of decoding information associated with the different read level. Decoding success rates are determined for one or more of the plurality of sets based on the one or more of the plurality of sets being used to successfully decode data and, for each different read level, an order of the plurality of sets is determined based on the determined success rates. A selected set of decoding information is selected for use in decoding raw data obtained from a read performed at a respective read level based on the respective read level and the set order of the plurality of sets for the respective read level.

20 Claims, 5 Drawing Sheets

(56) References Cited

U.S. PATENT DOCUMENTS

| | | | |
|---|---|---|---|
| 2015/0178612 A1* | 6/2015 | Hoffman | G06K 19/06056 |
| | | | 235/440 |
| 2015/0188577 A1 | 7/2015 | Ogawa et al. | |
| 2015/0242268 A1 | 8/2015 | Wu et al. | |
| 2015/0286528 A1* | 10/2015 | Cai | G06F 11/1004 |
| | | | 714/763 |
| 2015/0317099 A1* | 11/2015 | Resch | G06F 9/526 |
| | | | 710/74 |
| 2015/0365106 A1 | 12/2015 | Wu et al. | |
| 2016/0027521 A1* | 1/2016 | Lu | G11C 11/5642 |
| | | | 714/764 |
| 2016/0034349 A1* | 2/2016 | Choi | G11C 11/5642 |
| | | | 714/764 |
| 2016/0274969 A1* | 9/2016 | Chen | H03M 13/45 |
| 2016/0276039 A1* | 9/2016 | Cai | G11C 16/28 |
| 2016/0299844 A1* | 10/2016 | Sprouse | G06F 12/0246 |
| 2016/0301427 A1* | 10/2016 | Sprouse | H03M 13/353 |
| 2016/0350179 A1* | 12/2016 | Lin | G11C 29/52 |
| 2017/0013159 A1* | 1/2017 | Morino | H04N 1/2158 |
| 2017/0024279 A1* | 1/2017 | Lu | G06F 11/1068 |
| 2017/0091028 A1* | 3/2017 | Golan | G11C 16/349 |
| 2017/0111661 A1* | 4/2017 | Boyce | H04N 19/44 |
| 2017/0150159 A1* | 5/2017 | Lee | H04N 19/423 |
| 2017/0156015 A1* | 6/2017 | Stockhammer | H04S 3/006 |
| 2017/0168894 A1* | 6/2017 | Kim | G06F 11/1068 |
| 2017/0351460 A1* | 12/2017 | Oh | G06F 3/0659 |
| 2017/0353271 A1* | 12/2017 | Kudekar | H04L 1/0063 |
| 2018/0007365 A1* | 1/2018 | Lawrence | H04N 19/139 |

* cited by examiner

DYNAMIC SELECTION OF SOFT DECODING INFORMATION

BACKGROUND

The present disclosure relates to the soft decoding of raw data obtained from flash memory devices, such as solid-state drives (SSDs). Lower priced Solid State Drives (SSD) are typically manufactured using multi-level cell (MLC) flash memory for increased data capacity, but MLC memory devices are sometimes less reliable than single-level cell (SLC) flash memory. Consumer SSD manufacturers have mitigated reliability issues by employing certain wear-leveling algorithms. Using MLC flash memory in enterprise applications has become more expensive due to a gradual degradation in endurance from increased (wear causing) stresses required to read, program and erase the flash memory.

SUMMARY

The subject technology relates to a method for dynamic selection of soft decoding information. According to various aspects, a data storage device may comprise one or more flash memory devices, each comprising a plurality of memory cells, and a controller. The controller may be configured to initiate multiple reads of the plurality of memory cells of the flash memory device at different read levels to obtain raw data, initiate, for each different read level, multiple decoding operations to decode the raw data, each decoding operation using a different one of a plurality of sets of decoding information associated with the different read level, determine decoding success rates for one or more of the plurality of sets based on the one or more of the plurality of sets being used to successfully decode data, set, for each different read level, an order of the plurality of sets based on the determined success rates, and select, for use in decoding raw data obtained from a read performed at a respective read level, a selected set of decoding information based on the respective read level and the set order of the plurality of sets for the respective read level.

The controller may be further configured to periodically adjust a counter based on a number of errors corrected for each respective period, wherein the counter is incremented if a first set of the plurality of sets corrected more errors in a respective period than a second set of the plurality of sets, and the counter is decremented if the second set of the plurality of sets corrected more errors in the respective period than the first set of the plurality of sets. In this regard, the selected set may be selected based on a value of the counter being associated with the respective set. Other aspects include corresponding systems, methods, and computer program products for implementation of the foregoing device.

It is understood that other configurations of the present disclosure will become readily apparent to those skilled in the art from the following detailed description, wherein various configurations of the present disclosure are shown and described by way of illustration. As will be realized, the present disclosure is capable of other and different configurations and its several details are capable of modification in various other respects, all without departing from the scope of the present disclosure. Accordingly, the drawings and detailed description are to be regarded as illustrative in nature and not as restrictive.

DETAILED DESCRIPTION

The detailed description set forth below is intended as a description of various configurations of the present disclosure and is not intended to represent the only configurations in which the present disclosure may be practiced. The appended drawings are incorporated herein and constitute a part of the detailed description. The detailed description includes specific details for the purpose of providing a thorough understanding of the present disclosure. However, it will be apparent to those skilled in the art that the present disclosure may be practiced without these specific details. In some instances, structures and components are shown in block diagram form in order to avoid obscuring the concepts of the present disclosure. Like components are labeled with identical element numbers for ease of understanding.

The subject technology improves LDPC performance of a data storage system by providing faster decoding than conventional systems. Memory cells are potentially read multiple times at different read levels. For each different read level, multiple decoding operations are initiated to decode the raw data, with each decoding operation using a different one of multiple sets of decoding information. The reading of the memory cells and corresponding decoding operations are stopped when the data is successfully decoded. Periodically, decoding success rates are determined for the sets of decoding information based on the sets being used to successfully decode data and, for each different read level, a selection order for the sets is determined based on the determined success rates. This selection order is automatically adjusted throughout the lifetime of the data storage system so that the set of decoding information having the highest probability of decoding the raw data (e.g., based on the success rates) may be selected for a read operation before other sets are used.

Figure 1:
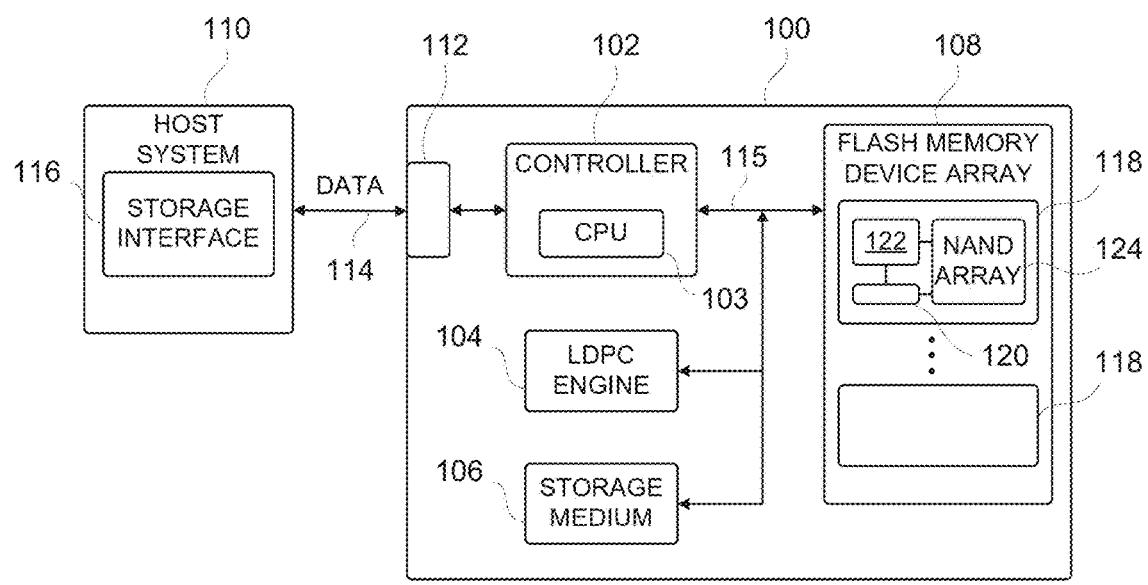
FIG. 1 is a block diagram depicting example components of a data storage system.

FIG. 1 is a block diagram depicting example components of a data storage system 100, according to aspects of the subject technology. Data storage system 100 includes, among other things, a controller 102, a low-density parity-check (LDPC) engine 104, a storage medium 106, and a flash memory device array 108. As depicted in FIG. 1, data storage system 100 may be connected to a host device 110 via a host interface 112.

Controller 102 may include several internal components (not shown) such as one or more processors 103, a read-only memory, a flash component interface (for example, a multiplexer to manage instruction and data transport along a connection to flash memory device array 108), an I/O interface, error correction circuitry, and the like. A processor of controller 102 may monitor and control the operation of the components in data storage controller 102. The processor may be a multi-core processor, a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or a combination of the foregoing. In some aspects, one or more elements of controller 102 may be integrated into a single chip. In other aspects, the elements may be implemented on two or more discrete components.

Controller 102 (or one or more of the previously described components therein) may be configured to execute code or instructions to perform the operations and functionality described herein. For example, controller 102 may be configured to perform operations for managing request flow and address mappings, and to perform calculations and generate commands. One or more sequences of instructions may be stored as firmware on memory within controller 102. One or more sequences of instructions may be software stored and read from storage medium 106, flash memory device array 108, or received from host device 110 (for example, via host interface 112). Storage medium 106 and flash memory device array 108 represent examples of machine or computer readable media on which instructions/code executable by controller 102 may be stored. Machine or computer readable media may generally refer to any tangible and/or non-transitory medium or media used to provide instructions to controller 102, including both volatile media, such as dynamic memory used for storage media 102 or for buffers within controller 102, and non-volatile media, such as electronic media, optical media, and magnetic media.

In some aspects, storage medium 106 represents volatile memory used to temporarily store data and information used to manage data storage system 100. According to one aspect of the present disclosure, storage medium 106 is random access memory (RAM) such as double data rate (DDR) RAM. Other types of RAM also may be used to implement storage medium 106. Storage medium 106 may be implemented using a single RAM module or multiple RAM modules. While storage medium 106 is depicted as being distinct from controller 102, it is understood that storage medium 106 may be incorporated into controller 102 without departing from the scope of the present disclosure. Alternatively, storage medium 106 may be a non-volatile memory such as a magnetic disk, flash memory, peripheral SSD, and the like.

Host interface 112 is configured to be coupled to host device 110, to receive data from and send data to host device 110. Host interface 112 may include both electrical and physical connections for operably coupling host device 110 to controller 102. Host interface 112 is configured to communicate data, addresses, and control signals between host device 110 and controller 102. In this manner, controller 102 is configured to store data received from host device 102 in flash memory device array 108 in response to a write command from host device 110, and to read data stored in flash memory device array 108 and to transfer the read data to host device 110 via host interface 112 in response to a read command from host device 110.

Host device 110 represents any device configured to be coupled to data storage system 110 and to store data in data storage system 100. Host device 110 may be a computing system such as a personal computer, a server, a workstation, a laptop computer, PDA, smart phone, and the like. Alternatively, host device 110 may be an electronic device such as a digital camera, a digital audio player, a digital video recorder, and the like.

As further depicted in FIG. 1, host device 110 and data storage system 100 may be in communication with each other via a bus 114. The bus may use suitable interfaces standard including, but not limited to, Serial Advanced Technology Attachment (SATA), Advanced Technology Attachment (ATA), Small Computer System Interface (SCSI), PCI-extended (PCI-X), Fibre Channel. Serial Attached SCSI (SAS). Secure Digital (SD), Embedded Multi-Media Card (EMMC), Universal Flash Storage (UFS) and Peripheral Component Interconnect Express (PCIe). According to some aspects, data storage system 100 may include pins (or a socket) to mate with a corresponding socket (or pins) on host device 110 to establish an electrical and physical connection.

Controller may include an internal system bus 115. System bus 115 may include a combination of a control bus, address bus, and data bus, and connect the components of controller 110 (e.g., a processor and/or memory therein) with other components of data storage system 100, including storage LDPC engine 104, storage medium 106, flash memory device array 108, and host interface 112. Data is transferred between the various components over system bus 115. System bus 115 may reside partially external and partially internal to controller 102.

Host device 110 and data storage system 100 may be in communication with each other via a wired or wireless connection and may be local to or remote from one another. According to one or more other aspects, data storage system 100 (or host interface 112) includes a wireless transceiver to place host device 110 and data storage system 100 in wireless communication with each other.

Controller 102 may be configured to receive data and/or storage access commands from a storage interface module 116 (e.g., a device driver) of host device 110. Storage access commands communicated by the storage interface module 116 may include read and write commands issued by the host device 110. Read and write commands may specify a logical address (e.g., logical block addresses or LBAs) used to access the data storage system 100. Controller 102 may execute the commands received from storage interface module 116 in the flash memory device array 108.

Flash memory device array 108 may include multiple flash memory devices 118. A flash memory device 118 represents a non-volatile memory device for storing data. According to one aspect of the subject technology, flash memory device 118 includes, for example, a NAND flash memory. Flash memory device 118 may include a single flash memory device or chip/die, or may include multiple flash memory devices or chips/die arranged in multiple channels. For example, within flash memory device array 108, some of the flash memory devices 118 may comprise one flash die while others may comprise more than one flash die. Flash memory device 118 is not limited to any particular capacity or configuration. For example, the number of physical blocks, the number of physical pages per physical block, the number of sectors per physical page, and the size of the sectors may vary within the scope of the subject technology.

A flash memory device 118 may include one or more flash memory interfaces (not shown). Each flash memory interface interfaces the controller 102 to one of the flash memory devices via a corresponding channel. Each of the channels (not shown) may be implemented using one or more physical I/O buses coupled between one of the flash memory interfaces and the corresponding flash device(s). Each channel allows the corresponding flash memory interface to send read, write and/or erase commands to the corresponding flash memory device. Each flash memory interface may include a register (e.g., First-In-First-Out (FIFO) register) that queues read, write and/or erase commands from the controller 102 for the corresponding flash memory device. Although the term "channel," as used above, referred to the bus coupled between a flash memory interface and the corresponding flash memory device, the term "channel" may also refer to the corresponding flash memory device that is addressable through a bus (e.g., system bus 115).

Flash memory device 118 may have a standard interface specification. This standard ensures that chips from multiple manufacturers can be used interchangeably (at least to a large degree). The interface hides the inner working of the flash memory and returns only internally detected bit values for data. In one aspect, the interface of flash memory device 118 is used to access one or more internal registers 120 and an internal flash controller 122 for communication by external devices. In some aspects, registers 120 may include address, command, and/or data registers, which internally retrieve and output the necessary data to and from a NAND memory cell array 124. By way of example, memory cell array 124 may comprise a single-level cell (SLC) memory, a multi-level cell (MLC) memory, a three-level cell (TLC) memory device, etc. In some aspects, the flash memory device array 108 may comprise one or more hybrid memory devices that may function in one or more of a SLC, MLC or TLC mode.

A data register (e.g., of registers 120) may include data to be stored in memory cell array 124, or data after a fetch from memory cell array 124, and may also be used for temporary data storage and/or act like a buffer. An address register may store the memory address from which data will be fetched to host device 110 or the address to which data will be sent and stored. In some aspects, a command register is included to control parity, interrupt control, and the like. In some aspects, internal flash controller 122 is accessible via a control register to control the general behavior of flash memory device 118. Internal flash controller 122 and/or the control register may control the number of stop bits, word length, receiver clock source, and may also control switching the addressing mode, paging control, coprocessor control, and the like.

LDPC engine 104 represents one or more components configured to encode and/or decode code words to be stored in the flash memory device array 108. LDPC engine 104 may include an encoder and a decoder (not shown). The decoder may include a hard decoder and a soft-decision ECC decoder. LDPC engine 104 may encode data received from host device 100 and decode code words read from the flash memory array 118 before sending the decoded data to the host. In some implementations, LDPC engine 104 may comprise one or more memory devices and/or one or more processing units used to perform error correction (e.g., using LDPC or turbo codes). LDPC engine 104 may also include a soft information module (not shown) that determines and/or maintains soft metric inputs for encoding and decoding operations. While LDPC engine 104 is depicted as being distinct from controller 102, it is understood that LDPC engine 104 may be incorporated into controller 102 without departing from the scope of the present disclosure.

Controller 102 is operable to, by communicating with a flash channel, determine putative program levels (e.g., determined by a first read operation) for memory cells in a flash memory device and determine, via LDPC engine 104, a probability that the memory cells are indeed programmed to their putative program levels. For example, a putative program level may be determined by reading a memory cell at a first read level voltage. Controller 102 may then determine a probability that the memory cell is programmed to its putative program level based on a series of subsequent reads of the memory cell at different levels.

Figure 2:
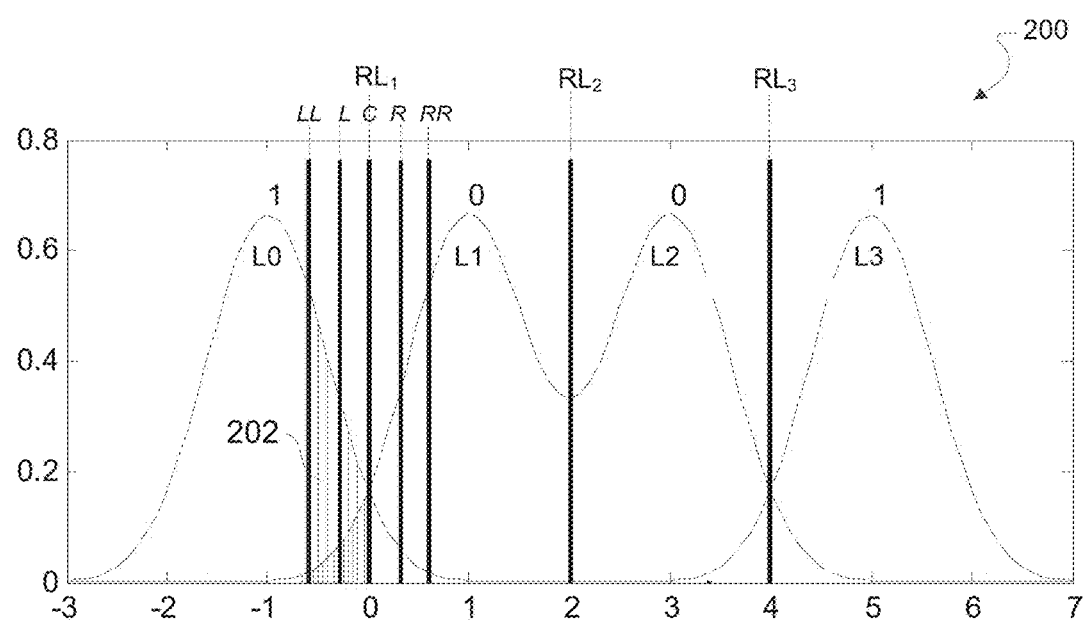
FIG. 2 depicts an example graph diagram of four possible cell program distributions and complimentary cell read levels in a multi-level cell flash memory.

FIG. 2 depicts an example graph diagram 200 of four possible cell program distributions and complimentary cell read levels in a multi-level cell flash memory, according to aspects of the subject technology. As depicted, a MLC NAND cell is capable of storing four states (amounts of charge) per cell, yielding two logical bits of information per cell: the Most Significant Bit (MSB) and the Least Significant Bit (LSB). When memory cells are read or programmed, these two bits may make up corresponding MSB and LSB pages of a memory block. Accordingly, a memory cell in a page, sector, or other unit of memory may be programmed to any one of the four states, making up one or more cell programming distributions L0, L1, L2, L3 for the unit of memory.

To ensure that cells in an expected distribution will conduct when a read operation is performed, a read level voltage greater than the expected distribution is applied. In various examples described herein, a first read level RL1 corresponds to the L0 threshold voltage, a second read level RL2 corresponds to the L1 threshold voltage, and a third read level RL3 corresponds to the L2 threshold voltage. In this regard, RL1 voltage will cause cells in the L0 distribution to conduct, RL2 voltage will cause cells in the L1 distribution to conduct, RL3 voltage will cause cells in the L2 distribution to conduct, and so on. Where, as depicted by FIG. 1, only four states are available, RL3 voltage will not cause any cells in L3 distribution to conduct. The failure of cells to conduct at RL3 generates a binary x0 in the LSB for those cells. Generally, for N distributions there will be N−1 read levels. In the depicted example, there are four distributions (states) and three read levels. However, it is understood that there may be eight, sixteen, or more distributions without departing from the scope of the subject technology.

As a flash memory is cycled (that is, programmed and erased repeatedly), its physical qualities change. For example, the repeated placement and removal of electrons on the floating gate during programming and erase operations, respectively, causes some excess electrons to be trapped in the device. The threshold voltages of these memory cells may eventually take values that are different (higher or lower) than expected values, causing the cell programming distributions ultimately begin to overlap, and causing errors when the data is read.

To determine a probability that the memory cells were actually programmed to the observed putative program levels, multiple soft reads may be initiated. In the depicted example, the memory cells are first read at an initial read level C. This initial read level C may be any of previously described RL1, RL2, or RL3 used to determine a corresponding distribution L0, L1, and L2, respectively. In the depicted example, after the memory cells are read at the initial read level C (e.g., at RL1, RL2, or RL3), the memory cells are then read using a second read level LL below read level C, and a third read level RR above the read level C. These 'soft reads' set up multiple program regions that may be used to categorize the raw data values read from the memory cells for soft decoding, should hard decoding of the raw data fail.

A first program region includes one or more cells having a programmed value between initial read level C and the second read level LL, and a second program region comprises one or more cells having a programmed value between read level C and the third read level RR. In the depicted example, the memory cells are read using a fourth read level L below the initial read level C and above the second read level LL, and a fifth read level R above the initial read level C and below the third read level RR. Further reads may follow in a similar pattern (e.g., at LLL, RRR, etc.).

The previously described programming regions between read levels may also be referred to herein as "bins." In traditional decoding, one or more 'soft metric inputs' suitable for a soft-decision ECC decoder may be calculated for each bin after error correction, based on how many of the memory cells are in the bin compared to one or more other bins. A soft metric input may be a confidence value determined for a bin based on an area 202 under a distribution curve for the bin. The confidence value may then be assigned to each memory cell in the corresponding bin using a mapping table. As will be described further, these confidence values may include log-likelihood ratios (LLRs).

In low-density parity-check (LDPC) applications, a binary LLR may include the logarithm of a ratio between the probability of a bit being "0" or "1". A positive LLR may indicate that a signal read from the memory cell may likely be a 0-bit, and a negative LLR may indicate that the signal read from the memory cell may likely be a 1-bit. In some examples, a bit value having an assigned LLR equal to five may be more likely to be a first predetermined value (e.g., a binary "0") than a bit value having an assigned LLR equal to a second predetermined value (e.g., a binary "1"). A bit value having an assigned LLR equal to zero may be equally likely to be either predetermined value. An LLR may also be represented by a non-binary confidence vector having a group of component values.

In traditional decoding schemes, multiple bins (and multiple LLR values) are created to determine each potential programming level. For each potential programming level, the different LLR values belonging to the different bins are grouped in an LLR mapping table. When a memory cell is determined to be associated with a bin number, a LLR value may be mapped to the raw data value of the memory cell via the bin number in the LLR mapping table.

In some implementations, LLRs (or other type of soft metrics) are generated based on reading reference memory cells, generating a set of confidence values (or LLRs) based on a binning of the reference cells, and determining the area under the respective curves for the bins. A LLR mapping table is then generated based on the LLRs generated for the obtained program values of the reference cells and the respective bins. This set of soft metric inputs may then be used in future decoding operations during operation of the storage device. In some implementations, a set of soft metric inputs may be generated based on manufacturing data.

A set of soft metric inputs such as confidence values or LLR values is generally described herein as a set of decoding information. A respective set of decoding information may, for example, be an LLR mapping table.

Traditionally, there is only one LLR mapping table providing the set of decoding information. According to the subject technology, multiple sets of decoding information may be used to decode raw data. For example, at least three LLR mapping tables may be used. As will be described further, instead of binning the cells after multiple reads, the cells may be binned after the initial read and after each subsequent soft read, and for each read a soft decoding of the cells may be attempted using a selected one of the three LLR mapping tables. The LLR mapping tables are selected for each decoding according to a set order.

According to various implementations, when performing decoding operations LDPC engine 104 may use different sets of decoding information and different orderings of the sets of decoding information for each read level. Further, different sets of decoding information can be used based on the age of a respective block(s) of the memory device. For example, the age of a block(s) may be based on a number of programming/erase cycles associated with the block being within a predetermined range of programming/erase cycles, and there may be a different group of three sets of decoding information for each predetermined range of programming/ erase cycles (and/or for each read level).

Figure 3:
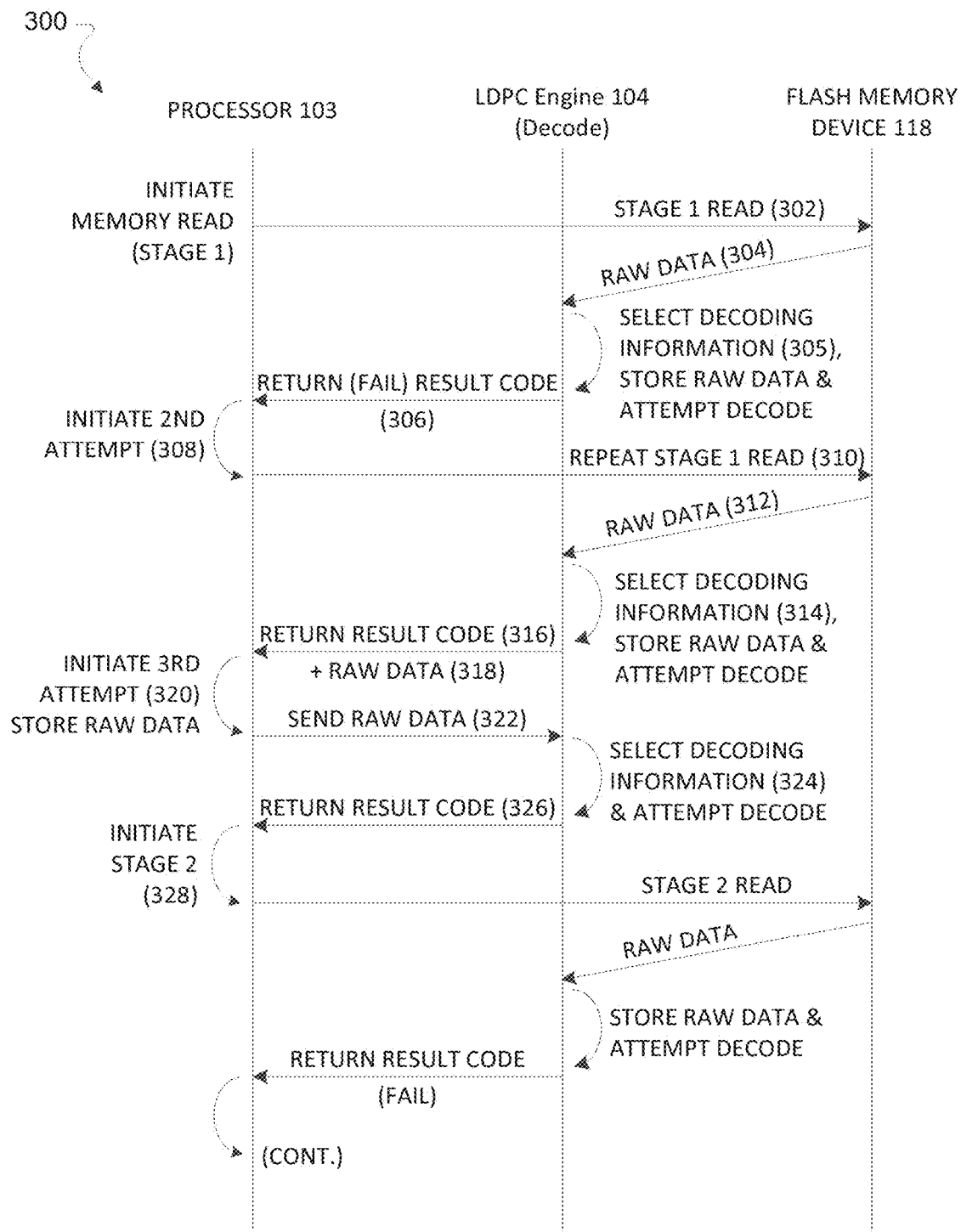
FIG. 3 depicts a flow diagram of an example multi-stage process for reading and decoding raw data stored in a flash memory device.

FIG. 3 depicts a flow diagram of an example multi-stage process 300 for reading and decoding raw data stored in a flash memory device 118, according to various aspects of the subject technology. The depicted example, illustrates how processor 103 and LDPC engine 104 work together to read data from flash memory device 118. As described previously, processor 103 and LDPC engine 104 may be implemented within or as part of controller 102.

When controller 102 determines that data is to be read from memory cells on flash memory device 118 (e.g., in response to a read request from host device 110), a multi-stage decoding process is initiated in which multiple attempts to read and/or decode the data may be made. Each stage of the multi-stage decoding process includes one or more read operations performed on the memory cells to obtain raw data, and one or more decoding operations which are initiated sequentially to decode the data. In accordance with various aspects of the subject technology, each read performed during the same stage is performed using the same read level, but decoded using a different set of decoding information. Additional decoding operations may be made based on previously read raw data without further reading the memory cells.

The read operations of each respective stage may use a read level different than the other stages. As will be described further, the stages of the multi-stage decoding process are executed sequentially until a respective decoding operation in one of the stages succeeds or all decoding operations in all of the stages fail.

In stage one of the multi-stage decoding process, controller 102 initiates a first read (302) of the target memory cells to obtain raw data. The target memory cells are read at a first read level C. In this regard, processor 103 may send an instruction to the flash device to read the target memory cells and to return the raw data. Flash memory device 118 executes on the instruction and returns (304) the raw data to LDPC engine 104 for decoding. Flash memory device 118 may place the data on bus 115 for LDPC engine 104. Processor 103 may buffer a local copy of the raw data for LDPC engine 104, which then attempts to decode it. LDPC engine 104 may first attempt a hard decode of the raw data (not shown). If the hard decode fails, LDPC engine 104 may then initiate a soft decode using a selected set of decoding information.

Processor 103 (or LDPC engine 104) selects a set of decoding information from multiple available sets of decoding information (305) and LDPC engine 104 performs a soft decode operation on the raw data. How the set is selected is described below with reference to Table 1 and/or FIG. 4. With reference to FIG. 2, at this point, there are two bins into which the raw data may be categorized: left of C and right of C. The available sets of decoding information may include soft metric inputs for these two bins. If the decoding is successful, LDPC engine will notify processor 103 that the decoding was successful (e.g., via bus 115) and provide the decoded data to processor 103 for use in further operations (e.g., returning the data to host device 110). In the depicted example, the decoding operation fails, and LDPC engine 104 provides a failure result code to processor 103 (306), and processor 103 initiates further attempts to read and/or decode the data (308). The raw data may be buffered locally for use by LDPC engine 104, and may not be returned with the failure result code.

On receiving notification that the first read and decoding operations failed to decode the read raw data, processor 103 sends a second instruction (310) to repeat the read of the target memory cells in a second attempt at decoding the data. The target memory cells are reread at the same read level C. The raw data is again returned (312) and stored locally for decoding by LDPC engine 104. As will be described further, this time, LDPC engine selects a different set of decoding information (314) to decode the data. According to various implementations, this set may also include soft metric inputs for the two bins. If the second attempt fails, LDPC engine 104 returns another failure result code to processor 103 (316). On the failure of the second attempt, LDPC engine 104 may also return the raw data (318). Before initiating further decoding, processor 104 may store the raw data, for example, in storage medium 106. The stored raw data may be used in further soft decoding operations, for example, in identifying the bins in which the raw data may be categorized after subsequent read operations (e.g., at different soft read levels).

Controller 102, continuing stage one of the decoding process, initiates a third attempt (320) at decoding the raw data. In the depicted example, processor 103 does not initiate another read of the target memory cells. Instead, processor 103 sends (322) the previously-read raw data (e.g., now stored in storage medium 106) to LDPC engine 104 for decoding. LDPC engine 104 selects another set of decoding information to decode the data (324), different than the sets selected during the first and second attempts, and performs a third attempt at decoding the raw data. If the decoding is successful, LDPC engine 104 will notify processor 103 that the decoding was successful and provide the decoded data to processor 103 for use in further operations. If the decoding was not successful, as depicted in FIG. 3, another failure result code is provided to processor 103 (326), and processor 103 initiates the second stage (328) of the multi-stage decoding process.

The forgoing three attempts to decode data may be repeated for each stage. As described previously, the reads performed at each stage may be performed at the same read level, different than read levels used at other stages. The read levels used may be selected according to the order of the soft reads of FIG. 2; for example, stage one may perform one or more reads at read level C (e.g., at RL1, RL2, or RL3), stage two may perform one or more reads at read level L, stage three may perform one or more reads at read level R, stage four may perform one or more reads at read level LL, and so on. With reference to FIG. 2, the number of bins used to categorize raw data values is determined based on the number of soft reads (and, e.g., previously stored raw data). For example, after stage two (e.g., read level L) there will be three bins (e.g., below L, between L and C, and above C), and after stage three (e.g., read level R) there may be four bins, and so on. Each set of decoding information used during a respective stage of the multi-stage process may include soft metric inputs corresponding to the available bins for the respective stage.

As described previously, each decoding operation selects one of multiple sets of decoding information. According to various aspects of the subject technology, a decoding operation selects one of three available LLR mapping tables. Table 1, below, provides an example of LLR mapping tables (labeled Tc, A−, A+) and their selection order for each stage in a multi-stage decoding process. Table 1 depicts three stages and seven read levels for each stage. It is understood that a multi-stage decoding process may include fewer or more stages and/or read levels. Fewer or more LLR mapping tables may also be available for selection. Additionally, Table 1 applies to read levels for determining whether memory cells are programmed above or below one distribution threshold (e.g., L0, L1, L2, or L3), and may be applicable to determining whether memory cells are programmed above or below other distribution thresholds.

TABLE 1

| Stage | Read Level | Selection Order | | |
|---|---|---|---|---|
| 1 | C | Tc | A− | A+ |
|   | L | A+ | Tc | A− |
|   | R | A+ | Tc | A− |
|   | LL | Tc | A− | A+ |
|   | RR | A− | Tc | A+ |
|   | LLL | A− | Tc | A+ |
|   | RRR | A+ | Tc | A− |
| 2 | C | Tc | A− | A+ |
|   | L | A+ | A− | Tc |
|   | R | A+ | A− | Tc |
|   | LL | A+ | A− | Tc |
|   | RR | A− | Tc | A+ |
|   | LLL | A+ | A− | Tc |
|   | RRR | Tc | A− | A+ |
| 3 | C | A− | Tc | A+ |
|   | L | Tc | A+ | A− |
|   | R | Tc | A+ | A− |
|   | LL | A− | A+ | Tc |
|   | RR | A− | A+ | Tc |
|   | LLL | A− | A+ | Tc |
|   | RRR | A− | A+ | Tc |

According to some implementations, the three LLR mapping tables used in decoding operations may be described as a center table Tc, asymmetric − table A−, and asymmetric + table A+. Each table includes different LLR values (or other soft metric inputs suitable for soft-decision ECC decoding). Tc may be representative of a LLR mapping table having default LLR values, or values determined (at least initially) as having the highest probability of correcting more errors. As described previously, an LLR value may be a binary LLR having a positive or negative value. In some implementations, A− and A+ may be representative of LLR mapping tables having LLR values biased differently than default LLR values. For example, A− may include a set of decoding information that biases the correction result to 0, A+ may include a set of decoding information that biases the correction result to 1, and Tc may be neutral, in a negative or positive direction, respectively). Tc, A−, and/or A+ may include values calculated according to other methods, and a description of how the values of the LLR mapping tables are calculated or determined is outside the scope of this document.

With brief reference to FIG. 3, for decoding operations at a particular read level, the LLR mapping table in the first column of the Selection Order is selected first, followed by the LLR mapping table in the second column, followed by the LLR mapping table in the third column. The exemplary selection order of the LLR mapping tables shown in Table 1 is representative of only one possible ordering of the LLR mapping tables. While table 1 depicts a seemingly random selection ordering of each row of Table 1 (stage/read level)

may be set to a default selection order (e.g., Tc, A−, then A+) and change over time or based on changing circumstances pertaining to the storage device, flash memory device, block, etc. According to various implementations, the selection order of the LLR mapping tables is based on the decoding success rates (and/or failure rates) of each of the mapping tables.

Figure 4:
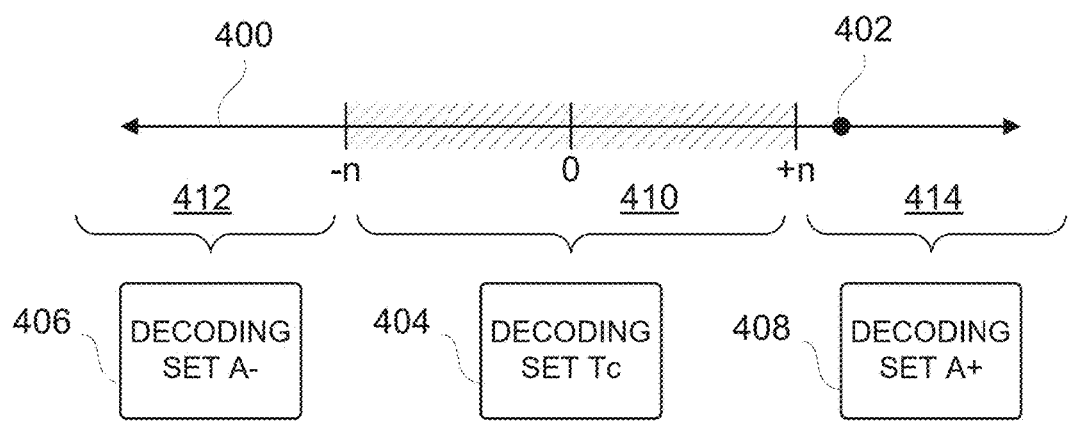
FIG. 4 depicts an example counter and an example relationship between its current value and an order in which sets of decoding information are selected for decoding operations.

FIG. 4 depicts an example counter 400 and an example relationship between its current value 402 and an order in which sets of decoding information are selected for decoding operations, according to various aspects of the subject technology. As described previously, each stage of a decoding process may select between three predetermined sets of decoding information (404, 406, 408) when initiating a decoding operation to decode raw data (obtained from reading memory cells at one of multiple read levels). According to various implementations, this selection may be facilitated by the use of counter 400.

Each possible set of decoding information made available for a stage of the multi-stage decoding process is associated with a range of possible values of counter 400. As depicted in FIG. 4, counter 400 may be bidirectional such that it counts in a positive or negative direction. In the depicted example, a first set 404 of decoding information (Tc) is associated with a first range 410 of values that encompasses the default value. First range 410 may be a range between a lower threshold −n and an upper threshold +n, as represented by the depicted hatch pattern. In some implementations, first range 410 may be a single value, such as the default value (e.g., zero). A second set 406 of decoding information (A−) is associated with a second range 412 of values that fall below the lower threshold −n of the first range of values. A third set 408 of decoding information (A+) is associated with a third range 414 of values that fall above the upper threshold +n of the first range of values. While only three ranges are depicted in the example of FIG. 4 any number of ranges and corresponding set associations are possible without departing from the scope of the present disclosure.

Initially, counter 400 is set to a default value (e.g., zero). According to various implementations, counter 400 may be reset to its default value periodically, after a predetermined number of read operations or after a predetermined amount of data is read (e.g., after every 32k reads). During each period, controller 102 may track the number of errors corrected by one or more of the sets of decoding information, and store the tracked number(s) in a memory (e.g., in storage medium 106). For example, controller 102 may track the number of errors corrected for second set 406 (A−) and third set 408 (A+), and not track the number of errors corrected for first set 404 (Tc). At the end of the period, controller may increment or decrement the counter based on which set of decoding information corrected the most errors, and then reset the tracked number of errors to zero. For example, second set 406 (A−) of decoding information is associated with values below threshold −n, and therefore if second set 306 successfully corrects more errors then counter 400 may be decremented. Third set 408 (A+) of decoding information is associated with values above threshold +n, and therefore if second set 408 successfully corrects more errors then counter 400 may be incremented. In the depicted example, counter 400 has been incremented more times than having been decremented, such that current value 402 is above threshold +n.

Controller 102 may not correct errors for first set 404 (Tc) because first set 404 may (at least initially) be known to have the highest probability of correcting more errors. At the end of each period, counter 400 will be adjusted or remain the same, resulting in current value 402 being within one of the three ranges 410, 412, or 414.

When a stage of the multi-stage decoding process is initiated, a set of decoding information (404, 406, or 408) is selected for decoding operations according to an order set based on current value 402 of counter 400. In this regard, the first selected set in a respective stage may be the set of decoding information (404, 406, or 408) associated with a range (410, 412, or 414) that includes current value 402 of counter 400. Where first range 410 only includes zero, the order of the sets may be based on whether current value 402 of counter 400 is positive, negative, or zero. If counter 400 is minus, second set 406 (A−) corrected more errors and is designated to be selected first. If counter 400 is plus, third set 408 (A+) corrected more errors and is designated to be selected first. If counter 400 is zero then the current ordering of the sets is balanced and there is no need to change the order.

After the first ordered set is designated, the remaining sets may be ordered according to a predetermined order, or ordered randomly. In one example, when the first selected set is a set other than first set 404 of decoding information, the second selected set may be first set 404 of decoding information, with the third selected set being the remaining set whose associated range (e.g., 412 or 414) is opposite the range (e.g., 414 or 412) associated with the first selected set. This selection order is depicted in the example Selection Order of Stage 1 in Table 1. In some implementations, after the first selected set is determined, the remaining sets may be selected in a predetermined order. For example, when the first selected set is first set 404 of decoding information (Tc) because current value 402 falls in range 410, the second selected set and third selected set may be selected in a predetermined order (e.g., second set 406 (A−) then third set 408 (A+)). This selection order is depicted in the example Selection Order of Stage 1 in Table 1. Stage 2 is an example of a different predetermined order. In some implementations, the second selected set may be selected randomly. A random selection order is depicted in the example Selection Order of Stage 3 in Table 1. In another example. Tc may always be selected first, followed by either A− or A+ (or Tc) depending on current value 402 of counter 400.

In some implementations, the value of counter 400 may be adjusted (e.g., incremented or decremented) based on a decoding operation successfully decoding raw data using a set of decoding information. In this regard, counter 400 may be incremented or decremented according to whether the range (410, 412, 414) associated with a successful set of decoding information is positively or negatively biased. For example, if second set 406 is successful then counter 400 may be decremented. In the depicted example, first set 404 of decoding information (Tc) is neither negatively nor positively biased. If first set 404 is successfully used in a decoding operation then counter 400 may remain at its current value. In one implementation where range 410 is more than one default value (e.g., zero), if first set 404 is successfully used in a decoding operation then counter 400 may be decremented or incremented to bring counter 400 towards the default value.

In some implementations, multiple counters may be used, with each set of decoding information (404, 406, 408) being associated with a different counter 400. The value of each respective counter is adjusted (e.g., incremented or decremented) each time a decoding operation successfully decodes raw data using the set of decoding information (404, 406, of 408) associated with the respective counter. The selection order of the sets of decoding information may then be based on the respective magnitudes of the counters. For example, the set of decoding information associated with the counter having a value of the greatest magnitude may be selected first, followed by the set associated with the counter having a value of the next greatest magnitude and so on.

According to some implementations, a different counter 400 and a different group of sets of decoding information may be used at each stage of the multi-stage decoding process. In this manner, as depicted in Table 1, each stage of the multi-stage decoding process may select sets of decoding information (e.g., 404, 406, 408) in a different order. The sets of decoding information at each stage may also include different soft metric inputs. For example, the soft metric inputs of first set (404) for stage one may be different than the soft metric inputs of first set (404) of stage two, and so on.

In some implementations, the foregoing arrangement(s) of counters and/or sets of decoding information may be used for each flash memory device 118 or flash memory die. Data storage system 100 may store in a predetermined area of memory (e.g., within storage medium 106 of flash memory device array 108) a data structure (e.g., a table) that includes all the counters 400 and associations between the counters and the available sets of decoding information. The data structure may be stored together with the available sets of decoding information (e.g., the actual soft metric inputs). In some implementations, the foregoing arrangement(s) of counters and/or sets of decoding information may be used (and selected) for each block of memory within a flash memory device 118 or flash memory die. This may require more memory space to maintain the counters and/or sets of decoding information; however, the additional memory space may be small compared to the amount of raw data stored for the same device 118 or memory die or memory block.

As described previously, different sets of decoding information can be used based on the age of a respective block(s) of the memory device. For example, the age of a block(s) may be based on a number of programming/erase cycles associated with the block being within a predetermined range of programming/erase cycles, and there may be a different group of three sets of decoding information for each predetermined range of programming/erase cycles (and/or for each read level). A different counter 400 may also be used for each age range, or the counter may be reset to the default value when a predetermined age range has been reached for the flash memory device 118 or respective die or block (e.g., upon reaching the lower threshold number of cycles of the next range). In some implementations, a single global counter 400 and/or a single global group of sets of decoding information may be used. Any combination of the foregoing associations between counters and stages and sets of decoding information is within the scope of this disclosure.

Figure 5:
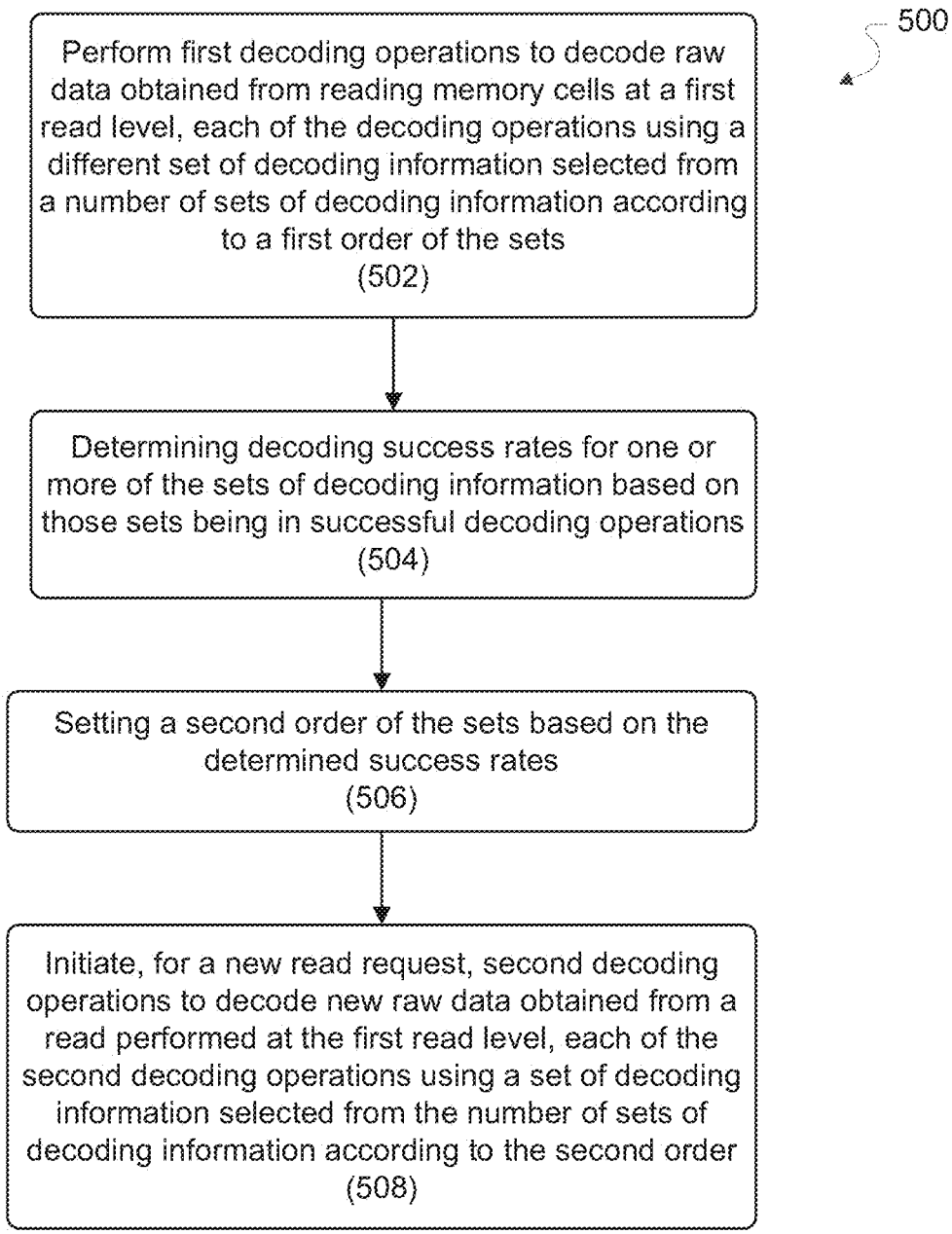
FIG. 5 depicts a flow diagram of a first example process for dynamically selecting soft decoding information to decode raw data.

FIG. 5 depicts a flow diagram of a first example process 500 for dynamically selecting soft decoding information to decode raw data, according to various aspects of the subject technology. For explanatory purposes, the various blocks of example process 500 are described herein with reference to the components and/or processes described herein. The one or more of the blocks of process 500 may be implemented, for example, by one or more processors, including, for example, controller 102 of FIG. 1 or one or more components or processors 103 of controller 102. In some implementations, one or more of the blocks may be implemented apart from other blocks, and by one or more different processors or controllers. Further for explanatory purposes, the blocks of example process 500 are described as occurring in serial, or linearly. However, multiple blocks of example process 500 may occur in parallel. In addition, the blocks of example process 500 need not be performed in the order shown and/or one or more of the blocks of example process 500 need not be performed.

Process 500 may be executed by the controller 102 and/or the LDPC engine 104. Controller 102 may initiate a multitude of read requests over a period of time, for example, on behalf of host device 110. In connection with one or more of these read requests, controller 102 performs first decoding operations to decode raw data obtained from reading memory cells at a first read level (502). Each of the decoding operations uses a different set of decoding information selected from a predetermined number of sets of decoding information according to a first order of the sets. As described previously, the sets of decoding information may include three tables of log-likelihood values.

For a respective read request, the memory cells may be reread multiple times using different read levels and, for each different read level, multiple decoding operations may be initiated to decode the raw data obtained from the memory cells. Each of the decoding operations may use a selected set of decoding information to decode the raw data. The selected set may be selected based on a read level used to read the raw data, and an order of the selected set among other sets of decoding information associated with the read level used to read the raw data.

Controller 102 determines decoding success rates for one or more of the sets of decoding information based on those sets being used in successful decoding operations (504). The success rates may be determined for decoding operations performed for a number of read requests, or for a predetermined amount of memory subject to being read (e.g., every 32k flash read). As described previously, the order of the sets may be based on a counter 400. Controller 102 may periodically adjust counter 400 based on a number of errors corrected for each respective period. Each period may correspond to an amount of memory that is read. As an example, a period may correspond to each 32k of memory that is read from a flash memory device 118. For each period, controller 102 may track the number of errors corrected by two or more sets of decoding information, and store the tracked number(s) in a memory (e.g., in storage medium 106). Counter 400 may then incremented if a first set of the predetermined number of sets corrected more errors in a respective period than a second set of the predetermined number of sets, and the counter 400 may be decremented if the second set corrected more errors in the respective period than the first set. The tracked number may then be reset to zero for each period.

Additionally or in the alternative, counter 400 may be adjusted each time the raw data is successfully decoded. For example, counter 400 may be incremented when the raw data is successfully decoded using a first set of the sets, and decremented when the raw data is successfully decoded using a second set of the sets. Alternatively, in some implementations, the counter may be decremented on the failure of the first set and incremented on the failure of the second set.

In some implementations, multiple counters may be used. In this regard, a first counter may be incremented based on successfully decoding raw data using a first set of the predetermined number of sets, and a second counter may be incremented based on successfully decoding raw data using a second set of the sets. As an example, the first counter may be incremented if the first set corrected more errors in a respective period than the second set, and the second counter may be incremented if the second set o corrected more errors in the respective period than the first set. In some implementations, a respective counter may be decremented based on the failure of a corresponding set to decode the raw data.

Controller 102 or LDPC engine 104 sets a second order of the sets (e.g., by updating the first order) based on the determined success rates (506). In implementations where a single counter is used, the selection order of the sets of decoding information may be based on a value of the counter. For example, with reference to FIG. 4, when current value 402 of counter 400 is within range 414 of the possible counter values, third set 408 of decoding information may be designated as first in the order of sets to be selected. In implementations where multiple counters 400 are used, the order of the sets may be determined by the respective magnitudes of the counters, such that the first ordered set is associated with the counter having a magnitude greater than a magnitude of the other counters. As described previously with regard to FIG. 4 and Table 1, after the first ordered set is determined, the remaining sets may be ordered according to a predetermined order or ordered randomly.

Controller 102 initiates, for a new read request, second decoding operations to decode new raw data obtained from a read performed at the first read level (508). Each of the second decoding operations uses a respective set of decoding information selected from the predetermined number of sets of decoding information according to the second order. In implementations using a single counter, a respective set may be selected based on a value of the counter being associated with the respective set. For example, with reference to FIG. 4, third set 408 of decoding information may be selected responsive to current value 402 being within range 414 of the possible counter values. According to some implementations, a respective order of the sets of decoding information may be set for each flash memory device 118 or each die based on a corresponding counter associated with the device or die. In implementations using multiple counters 400, a respective set may be selected based on a magnitude of a counter associated with the respective set being greater than a magnitude of one or more other counters (e.g., having the greatest magnitude or highest current value 402).

According to various implementations, the previously described first decoding operations may be performed in a first stage of a multi-stage decoding process. In response to the first stage failing to decode respective raw data obtained based on a first read level (e.g., read level C), a reread of the respective raw data may be initiated at a second read level (e.g., read level L or R). Second stage decoding operations are then initiated to decode the reread raw data. Each second stage decoding operation may use a different second set of decoding information. The second set of decoding information may be selected using a different order than the order used during the first stage. In this regard, multiple selection orders may be used, with each selection order being associated with a different read level. Accordingly, the previously described second set of decoding information may be selected from the sets of decoding information according to an ordering associated with the second read level.

In some implementations, the second set of decoding information may be selected from a different group of sets than the group of sets used during the first stage. In this regard, multiple groups of sets of decoding information may be used, with each group being associated with a different read level.

Using the subject technology, the order of the sets of decoding information may be automatically adjusted throughout the lifetime of data storage system 100 so that a set of decoding information having a higher probability of decoding the raw data than other sets may be selected first for most decoding operations. This improves LDPC performance by providing faster decoding than conventional systems.

Many of the above-described features of example process 500 and related features and applications, may be implemented as software processes that are specified as a set of instructions recorded on a computer readable storage medium (also referred to as computer readable medium). When these instructions are executed by one or more processing unit(s) (e.g., one or more processors, cores of processors, or other processing units), they cause the processing unit(s) to perform the actions indicated in the instructions. Examples of computer readable media include, but are not limited to, CD-ROMs, flash drives, RAM chips, hard drives, EPROMs, etc. The computer readable media does not include carrier waves and electronic signals passing wirelessly or over wired connections.

The term "software" is meant to include, where appropriate, firmware residing in read-only memory or applications stored in magnetic storage, which may be read into memory for processing by a processor. Also, in some implementations, multiple software aspects of the subject disclosure may be implemented as sub-parts of a larger program while remaining distinct software aspects of the subject disclosure. In some implementations, multiple software aspects may also be implemented as separate programs. Finally, any combination of separate programs that together implement a software aspect described here is within the scope of the subject disclosure. In some implementations, the software programs, when installed to operate on one or more electronic systems, define one or more specific machine implementations that execute and perform the operations of the software programs.

A computer program (also known as a program, software, software application, script, or code) may be written in any form of programming language, including compiled or interpreted languages, declarative or procedural languages, and it may be deployed in any form, including as a stand-alone program or as a module, component, subroutine, object, or other unit suitable for use in a computing environment. A computer program may, but need not, correspond to a file in a file system. A program may be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program may be deployed to be executed on one computer or on multiple computers that are located at one site or distributed across multiple sites and interconnected by a communication network.

It is understood that illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the present disclosure.

It is understood that the specific order or hierarchy of steps in the processes disclosed is presented as an illustration of some exemplary approaches. Based upon design preferences and/or other considerations, it is understood that the specific order or hierarchy of steps in the processes may be rearranged. For example, in some implementations some of the steps may be performed simultaneously. Thus the accompanying method claims present elements of the various steps in a sample order, and are not meant to be limited to the specific order or hierarchy presented.

The previous description is provided to enable any person skilled in the art to practice the various aspects described herein. The previous description provides various examples of the present disclosure, and the present disclosure is not limited to these examples. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

The predicate words "configured to", "operable to", and "programmed to" do not imply any particular tangible or intangible modification of a subject, but, rather, are intended to be used interchangeably. For example, a processor configured to monitor and control an operation or a component may also mean the processor being programmed to monitor and control the operation or the processor being operable to monitor and control the operation. Likewise, a processor configured to execute code may be construed as a processor programmed to execute code or operable to execute code.

The phrases "in communication with" and "coupled" mean in direct communication with or in indirect communication with via one or more components named or unnamed herein (e.g., a memory card reader)

A phrase such as an "aspect" does not imply that such aspect is essential to the present disclosure or that such aspect applies to all configurations of the present disclosure. A disclosure relating to an aspect may apply to all configurations, or one or more configurations. An aspect may provide one or more examples. A phrase such as an aspect may refer to one or more aspects and vice versa. A phrase such as an "implementation" does not imply that such implementation is essential to the present disclosure or that such implementation applies to all configurations of the present disclosure. A disclosure relating to an implementation may apply to all aspects, or one or more aspects. An implementation may provide one or more examples. A phrase such as an "implementation" may refer to one or more implementations and vice versa. A phrase such as a "configuration" does not imply that such configuration is essential to the present disclosure or that such configuration applies to all configurations of the present disclosure. A disclosure relating to a configuration may apply to all configurations, or one or more configurations. A configuration may provide one or more examples. A phrase such as a "configuration" may refer to one or more configurations and vice versa.

The word "exemplary" is used herein to mean "serving as an example or illustration." Any aspect or design described herein as "exemplary" is not necessarily to be construed as preferred or advantageous over other aspects or designs.

What is claimed is:

1. A machine-implemented method, comprising:
    performing, for a first read request, a first plurality of decoding operations to decode raw data obtained from reading a plurality of memory cells at a first read level, each of the first plurality of decoding operations using a different set of decoding information selected from a plurality of sets of decoding information according to a predetermined first order of the plurality of sets;
    determining decoding success rates for one or more of the plurality of sets based on using the one or more of the plurality of sets in a plurality of successful decoding operations;
    setting a second order of the plurality of sets, different than the first order, based on the determined success rates; and
    initiating, for a new read request, a second plurality of the decoding operations to decode new raw data obtained from a read performed at the first read level, each of the second plurality of the decoding operations using a set of decoding information selected from the plurality of sets according to the second order.

2. The machine-implemented method of claim 1, wherein setting the second order comprises:
    incrementing a counter based on successfully decoding the raw data using a first set of the plurality of sets; and
    decrementing the counter based on successfully decoding the raw data using a second set of the plurality of sets,
    wherein a respective set is selected based on a value of the counter being associated with the respective set.

3. The machine-implemented method of claim 2, wherein the counter is adjusted periodically based on a number of errors corrected for each respective period.

4. The machine-implemented method of claim 2, wherein a respective order of the plurality of sets is set for each die of a plurality of die based on a corresponding counter associated with the die.

5. The machine-implemented method of claim 1, wherein setting the second order comprises:
    incrementing a first counter based on successfully decoding the raw data using a first set of the plurality of sets; and
    incrementing a second counter based on successfully decoding the raw data using a second set of the plurality of sets,
    wherein a respective set is selected based on a magnitude of a counter associated with the respective set being greater than a magnitude of one or more other counters.

6. The machine-implemented method of claim 1, wherein the first plurality of decoding operations are performed in a first stage of a multi-stage decoding process, the multi-stage decoding process comprising stages that are executed sequentially until a respective decoding operation in one of the stages succeeds or all decoding operations in all of the stages fail, the method further comprising:
    initiating, in response to the first stage failing to decode respective raw data obtained based on the first read level, a reread of the respective raw data at a second read level; and initiating a plurality of second stage decoding operations to decode the reread raw data, each second stage decoding operation using a different second set of decoding information selected from the plurality of sets of decoding information according to an ordering associated with the second read level.

7. The machine-implemented method of claim 6, wherein, for a respective read request, the plurality of memory cells are reread multiple times using different read levels and, for each different read level, multiple decoding operations are initiated to decode raw data obtained from the plurality of memory cells; and wherein each of the multiple decoding operations uses a selected set of decoding information to decode the raw data, the selected set being selected based on a read level used to read the raw data and an order of the selected set among other sets of decoding information associated with the read level used to read the raw data.

8. A data storage system, comprising:
a flash memory device comprising a plurality of memory cells; and
a controller, the controller configured to:
   initiate multiple reads of the plurality of memory cells of the flash memory device at different read levels to obtain raw data;
   initiate, for each different read level, multiple decoding operations to decode the raw data, each decoding operation using a different one of a plurality of sets of decoding information associated with the different read level;
   determine decoding success rates for one or more of the plurality of sets based on the one or more of the plurality of sets being used to successfully decode data;
   set, for each different read level, an order of the plurality of sets based on the determined success rates, the set order being different than a prior order; and
   select, for use in decoding raw data obtained from a read performed at a respective read level, a selected set of decoding information based on the respective read level and the set order of the plurality of sets for the respective read level.

9. The data storage system of claim 8, wherein the controller being configured to determine decoding success rates comprises the controller being configured to:
periodically adjust a counter based on a number of errors corrected for each respective period, wherein the counter is incremented if a first set of the plurality of sets corrected more errors in a respective period than a second set of the plurality of sets, and the counter is decremented if the second set of the plurality of sets corrected more errors in the respective period than the first set of the plurality of sets, and
wherein the controller is configured to select the selected set based on a value of the counter being associated with the respective set.

10. The data storage system of claim 9, wherein controller is configured to set the a respective order of the plurality of sets for each die of a plurality of die based on a corresponding counter associated with the die.

11. The data storage system of claim 8, wherein the controller being configured to determine decoding success rates comprises the controller being configured to:
periodically adjust a first counter or a second counter based on a number of errors corrected for each respective period, wherein the first counter is incremented if a first set of the plurality of sets corrected more errors in a respective period than a second set of the plurality of sets, and the second counter is incremented if the second set of the plurality of sets corrected more errors in the respective period than the first set of the plurality of sets, and
wherein the controller is configured to select the selected set based on a magnitude of a counter associated with the selected set being greater than a magnitude of one or more other counters.

12. The data storage system of claim 8, wherein the controller is configured to:
initiate, in response to a first plurality of decoding operations failing to decode respective raw data obtained based on a first read level, a reread of the respective raw data at a second read level; and
attempt to decode the reread raw data using a second plurality of decoding operations, wherein the controller is configured to cause each of the second plurality of decoding operations to use a different set of decoding information selected from the plurality of sets of decoding information according to an ordering associated with the second read level.

13. The data storage system of claim 8, wherein, for a respective read request, the controller is configured to cause the plurality of memory cells to be reread multiple times using different read levels and, for each different read level, the controller is configured to initiate multiple decoding operations to decode raw data obtained from the plurality of memory cells; and
wherein the controller is configured to cause each of the multiple decoding operations to use a selected set of decoding information to decode the raw data, the selected set being based on a read level used to read the raw data and an order of the selected set among other sets of decoding information associated with the read level used to read the raw data.

14. The data storage system of claim 8, wherein the plurality of sets of decoding information comprises three tables of log-likelihood values.

15. A data storage controller, comprising:
means for performing, for a first read request, a first plurality of decoding operations to decode raw data obtained from reading a plurality of memory cells at a first read level, each of the first plurality of decoding operations using a different set of decoding information selected from a plurality of sets of decoding information according to a predetermined first order of the plurality of sets;
means for determining decoding success rates for one or more of the plurality of sets based on using the one or more of the plurality of sets in a plurality of successful decoding operations;
means for setting a second order of the plurality of sets, different than the first order, based on the determined success rates; and
means for initiating, for a new read request, a second plurality of the decoding operations to decode new raw data obtained from a read performed at the first read level, each of the second plurality of the decoding operations using a selected set of decoding information selected from the plurality of sets based on the second order.

16. The data storage controller of claim 15, wherein the means for setting the second order comprises:
means for periodically adjusting a counter based on a number of errors corrected for each respective period, wherein the counter is configured to be incremented if a first set of the plurality of sets corrected more errors in a respective period than a second set of the plurality of sets, and the counter is configured to be decremented if the second set of the plurality of sets corrected more errors in the respective period than the first set of the plurality of sets, and wherein the means for setting comprises selecting the selected set based on a value of the counter being associated with the respective set.

17. The data storage controller of claim 16, wherein the means for setting comprises setting a respective order of the plurality of sets for each die of a plurality of die based on a corresponding counter associated with the die.

18. The data storage controller of claim 15, wherein the means for setting the second order comprises:
  means for periodically adjusting a first counter or a second counter based on a number of errors corrected for each respective period, wherein the first counter is configured to be incremented if a first set of the plurality of sets corrected more errors in a respective period than a second set of the plurality of sets, and the second counter is configured to be incremented if the second set of the plurality of sets corrected more errors in the respective period than the first set of the plurality of sets, wherein the means for setting comprises setting the selected set based on a magnitude of a counter associated with the selected set being greater than a magnitude of one or more other counters.

19. The data storage controller of claim 15, wherein the means for performing comprises means for performing the first plurality of decoding operations in a first stage of a multi-stage decoding process, the multi-stage decoding process comprising stages that are executed sequentially until a respective decoding operation in one of the stages succeeds or all decoding operations in all of the stages fail.

20. The data storage controller of claim 19, further comprising:
  means for initiating, in response to the first stage failing to decode respective raw data obtained based on the first read level, a reread of the respective raw data at a second read level; and
  means for attempting to decode the reread raw data using a plurality of second stage decoding operations, each second stage decoding operation using a different second set of decoding information selected from the plurality of sets of decoding information according to an ordering associated with the second read level.

* * * * *